US012684934B2

(12) United States Patent
Ueta et al.

(10) Patent No.: US 12,684,934 B2
(45) Date of Patent: Jul. 14, 2026

(54) LIGHT-EMITTING DEVICE INCLUDING QUANTUM DOTS FOR ENHANCING LUMINOUS EFFICIENCY

(71) Applicant: SHARP KABUSHIKI KAISHA, Sakai City (JP)

(72) Inventors: Yoshihiro Ueta, Sakai City (JP); Keisuke Kitano, Sakai City (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 591 days.

(21) Appl. No.: 18/026,539

(22) PCT Filed: Sep. 18, 2020

(86) PCT No.: PCT/JP2020/035618
§ 371 (c)(1),
(2) Date: Mar. 15, 2023

(87) PCT Pub. No.: WO2022/059204
PCT Pub. Date: Mar. 24, 2022

(65) Prior Publication Data
US 2023/0380202 A1 Nov. 23, 2023

(51) Int. Cl.
*H10K 50/115* (2023.01)
*H10K 59/122* (2023.01)
*H10K 59/80* (2023.01)

(52) U.S. Cl.
CPC ......... *H10K 50/115* (2023.02); *H10K 59/122* (2023.02); *H10K 59/878* (2023.02)

(58) Field of Classification Search
CPC .. H10K 50/115; H10K 59/122; H10K 59/878; H10K 50/13; H05B 33/12; H05B 33/14; H05B 33/22
See application file for complete search history.

(56) References Cited

U.S. PATENT DOCUMENTS

| | | | | |
|---|---|---|---|---|
| 5,537,000 A * | 7/1996 | Alivisatos | .............. | B82Y 30/00 |
| | | | | 313/499 |
| 7,651,674 B2 * | 1/2010 | Jun | ...................... | C09K 11/565 |
| | | | | 977/773 |
| 7,910,400 B2 * | 3/2011 | Kwon | .................. | H10K 50/115 |
| | | | | 257/E21.007 |
| 8,128,249 B2 * | 3/2012 | Skipor | .................. | G06F 1/3218 |
| | | | | 362/84 |
| 9,768,404 B1 * | 9/2017 | Steckel | .................. | H10D 86/60 |
| 9,812,004 B1 * | 11/2017 | Boshernitzan | ......... | G08C 17/02 |

(Continued)

FOREIGN PATENT DOCUMENTS

| | | |
|---|---|---|
| JP | 2016103395 A | 6/2016 |
| JP | 2017091946 A | 5/2017 |

(Continued)

*Primary Examiner* — Caleb E Henry
(74) *Attorney, Agent, or Firm* — ScienBiziP, P.C.

(57) ABSTRACT

A light-emitting device includes: a first electrode; a second electrode; a light-emitting layer disposed between the first electrode and the second electrode; and a hole transport layer disposed between the first electrode and the light-emitting layer, wherein the light-emitting layer includes a first quantum dot including a first core with an emission peak in a visible light region, and a second quantum dot including a second core with an emission peak in a near-ultraviolet region or an ultraviolet region.

11 Claims, 16 Drawing Sheets

(56) References Cited

U.S. PATENT DOCUMENTS

| | | | | | |
|---|---|---|---|---|---|
| 9,831,706 | B2 * | 11/2017 | MacWilliams | ........... | H02J 7/32 |
| 9,874,693 | B2 * | 1/2018 | Baiocco | ............. | G02B 6/12004 |
| 10,394,378 | B2 * | 8/2019 | Huang | ................. | G06F 3/0412 |
| 10,826,011 | B1 * | 11/2020 | Angioni | ............... | H10K 59/122 |
| 10,873,048 | B2 * | 12/2020 | Lee | ........................ | H10K 50/15 |
| 11,508,880 | B2 * | 11/2022 | Treadway | ............. | H10K 59/38 |
| 2004/0183436 | A1 * | 9/2004 | Ito | ........................ | H10K 59/878 |
| | | | | | 313/506 |
| 2006/0039850 | A1 * | 2/2006 | Jun | ........................ | C09K 11/08 |
| | | | | | 423/561.1 |
| 2008/0203895 | A1 * | 8/2008 | Miller | .................. | C09K 11/883 |
| | | | | | 313/498 |
| 2010/0140586 | A1 * | 6/2010 | Char | ...................... | C01G 11/00 |
| | | | | | 257/14 |
| 2010/0244062 | A1 | 9/2010 | Ueno | | |
| 2011/0140075 | A1 * | 6/2011 | Zhou | .................... | H10K 59/131 |
| | | | | | 977/774 |
| 2012/0119200 | A1 * | 5/2012 | Ueno | .................. | C09K 11/671 |
| | | | | | 257/E51.026 |
| 2012/0280345 | A1 * | 11/2012 | Zhu | ...................... | G02B 6/1226 |
| | | | | | 257/E31.127 |
| 2013/0009131 | A1 * | 1/2013 | Kazlas | ................... | H10K 50/11 |
| | | | | | 257/13 |
| 2013/0037778 | A1 * | 2/2013 | Kazlas | .................. | H10H 20/01 |
| | | | | | 257/E29.024 |
| 2014/0027713 | A1 * | 1/2014 | Cox | .................. | H01L 21/02502 |
| | | | | | 438/47 |
| 2014/0027816 | A1 * | 1/2014 | Cea | ...................... | H10D 62/822 |
| | | | | | 257/E29.085 |
| 2014/0197507 | A1 * | 7/2014 | Assefa | .................. | H10F 39/807 |
| | | | | | 438/69 |
| 2014/0211451 | A1 * | 7/2014 | Wang | ...................... | H01J 1/304 |
| | | | | | 362/97.1 |
| 2015/0091093 | A1 * | 4/2015 | Bouche | .................. | H10D 64/62 |
| | | | | | 257/369 |
| 2015/0268417 | A1 * | 9/2015 | Assefa | ................. | G02B 6/4257 |
| | | | | | 385/14 |

| | | | | | |
|---|---|---|---|---|---|
| 2016/0027848 | A1 * | 1/2016 | Liu | ........................ | H10K 59/87 |
| | | | | | 257/40 |
| 2016/0155785 | A1 | 6/2016 | Sato | | |
| 2016/0164019 | A1 * | 6/2016 | Yu | .......................... | H05B 45/20 |
| | | | | | 438/46 |
| 2016/0240590 | A1 * | 8/2016 | Liu | ........................ | H10K 50/16 |
| 2016/0248029 | A1 * | 8/2016 | Liu | ...................... | H10K 59/351 |
| 2017/0115823 | A1 * | 4/2017 | Huang | ................. | G06F 3/0421 |
| 2017/0141167 | A1 | 5/2017 | Naganuma | | |
| 2017/0221969 | A1 * | 8/2017 | Steckel | .................. | H10K 59/32 |
| 2017/0279084 | A1 | 9/2017 | Sakamoto et al. | | |
| 2017/0294480 | A1 * | 10/2017 | Kwon | ................. | H10H 20/855 |
| 2017/0352779 | A1 * | 12/2017 | Kuzumoto | .............. | C08K 9/08 |
| 2018/0019371 | A1 * | 1/2018 | Steckel | ................ | C09K 11/883 |
| 2018/0076269 | A1 | 3/2018 | Naganuma | | |
| 2018/0254421 | A1 * | 9/2018 | Kinge | .................. | H10K 50/115 |
| 2018/0309078 | A1 * | 10/2018 | Ju | .......................... | H10K 50/15 |
| 2018/0351125 | A1 * | 12/2018 | He | ........................ | H10K 50/16 |
| 2018/0366672 | A1 * | 12/2018 | Wang | .................... | H10K 71/15 |
| 2019/0163016 | A1 * | 5/2019 | Kim | ..................... | H10H 20/812 |
| 2019/0280232 | A1 | 9/2019 | Chang et al. | | |
| 2019/0296264 | A1 * | 9/2019 | Mathai | ................. | H10K 50/115 |
| 2020/0174288 | A1 * | 6/2020 | Kim | ....................... | C09K 11/70 |
| 2020/0185462 | A1 * | 6/2020 | Lee | ........................ | H10K 50/15 |
| 2020/0203650 | A1 * | 6/2020 | Kim | ....................... | H10K 50/15 |
| 2020/0243616 | A1 * | 7/2020 | Boardman | ........... | H10K 50/11 |
| 2020/0313106 | A1 * | 10/2020 | Kim | ....................... | H10K 71/00 |
| 2020/0402686 | A1 * | 12/2020 | Pandey | .................. | H10N 60/83 |
| 2020/0411786 | A1 * | 12/2020 | Boardman | ........... | H10K 59/873 |
| 2021/0028385 | A1 * | 1/2021 | Sakakibara | ............ | H05B 33/10 |
| 2021/0151629 | A1 * | 5/2021 | Boardman | ........... | H10H 20/813 |
| 2021/0408416 | A1 * | 12/2021 | Angioni | .............. | H10K 71/441 |
| 2021/0408417 | A1 * | 12/2021 | Angioni | ............... | H10K 50/15 |
| 2022/0013744 | A1 * | 1/2022 | Sakakibara | .......... | H10K 50/115 |

FOREIGN PATENT DOCUMENTS

| | | | |
|---|---|---|---|
| JP | 2017092213 A | 5/2017 | |
| JP | 2017174553 A | 9/2017 | |
| WO | 2009041690 A1 | 4/2009 | |

* cited by examiner

101

1    2    9    8    4    5

3

| | FIRST CORE | | | | | SECOND CORE | | | | | |
|---|---|---|---|---|---|---|---|---|---|---|---|
| | MATERIAL | PARTICLE SIZE (nm) | CBM (eV) | VBM (eV) | EMMISSION PEAK (nm) | MATERIAL | PARTICLE SIZE (nm) | CBM (eV) | VBM (eV) | EMMISSION PEAK (nm) |
| Example 1 | CdSe | 3 | -2.7 | -5.5 | 450 | ZnCdSSe | 3 | -2.45 | -5.7 | 390 |
| Example 2 | CdSe | 5 | -2.7 | -5.5 | 630 | ZnSe | 4 | -2.38 | -5.6 | 395 |
| Example 3 | InP | 3 | -3.1 | -5.4 | 532 | ZnSe | 4 | -2.38 | -5.6 | 395 |
| Example 4 | C | 5 | -2.66 | -2.33 | 549 | C | 3 | -1.55 | -5.84 | 296 |

FIG. 3

HOLE INJECTION BARRIER DECREASE

GENERATION OF BAND DISCONTINUITY AT LIGHT-EMITTING LAYER BOUNDARY

LIGHT-EMITTING DEVICE INCLUDING QUANTUM DOTS FOR ENHANCING LUMINOUS EFFICIENCY

TECHNICAL FIELD

The disclosure relates to a light-emitting device.

BACKGROUND ART

In a Quantum dot Light Emitting Diode (QLED) light-emitting device, the density of electrons injected into a light-emitting layer is significantly higher than the density of holes injected into the light-emitting layer. Thus, the QLED light-emitting device has the problem of low luminous efficiency.

The technique described in PTL 1 is an example of a technique that can enhance the luminous efficiency of a QLED light-emitting device. In the technique described in PTL 1, luminous efficiency is enhanced by disposing non-emitting quantum dots at the periphery of light-emitting quantum dots and block electrons moving to a quantum dot layer (light-emitting layer).

CITATION LIST

Patent Literature

PTL 1: US 2019-0280232 A (published on Sep. 12, 2019)

SUMMARY

Technical Problem

In the technique described in PTL 1, to sufficiently enhance the luminous efficiency, the non-emitting quantum dots must be disposed with the highest density at the periphery of the light-emitting quantum dots. However, such an arrangement is not easily achieved.

In addition, in the technique described in PTL 1, a reactive current may be caused by a defect formed on the surface of a non-emitting quantum dot.

For the technique described in PTL 1, this may problematically cause the enhancement in luminous efficiency to be insufficient.

An object of one aspect of the disclosure is to sufficiently enhance luminous efficiency.

Solution to Problem

A light-emitting device according to an aspect of the disclosure includes: a first electrode; a second electrode; a light-emitting layer disposed between the first electrode and the second electrode; and a hole transport layer disposed between the first electrode and the light-emitting layer, wherein the light-emitting layer includes a first quantum dot including a first core with an emission peak in a visible light region, and a second quantum dot including a second core with an emission peak in a near-ultraviolet region or an ultraviolet region.

Advantageous Effects of Disclosure

According to an aspect of the disclosure, luminous efficiency can be sufficient enhanced.

BRIEF DESCRIPTION OF DRAWINGS

FIG. 3 is a table listing examples of material, particle size, conduction band minimum (CBM), valence band maximum (VBM), and emission peak for a first core and the second core.

DESCRIPTION OF EMBODIMENTS

Figure 1:
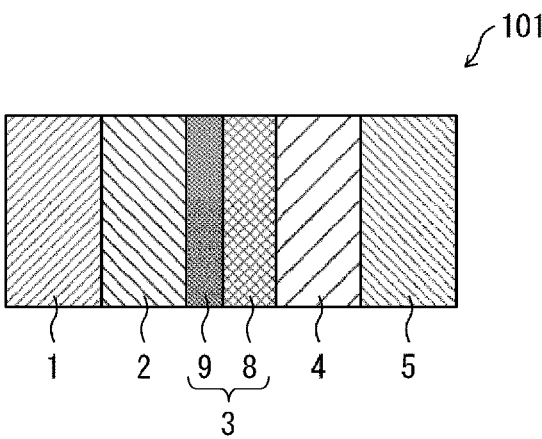
FIG. 1 is a cross-sectional view illustrating a schematic configuration of a light-emitting device according to a first embodiment of the disclosure.

Embodiments of the disclosure will be described below. Note that, for convenience of description, members having the same functions as the members described earlier may be denoted by the same reference numerals and signs, and the description thereof will not be repeated.

First Embodiment

FIG. 1 is a cross-sectional view illustrating a schematic configuration of a light-emitting device 101 according to a first embodiment of the disclosure. The light-emitting device 101 includes a first electrode 1, a hole transport layer 2, a light-emitting layer 3, an electron transport layer 4, and a second electrode 5. The first electrode 1 is an anode, and the second electrode 5 is a cathode.

The light-emitting device 101 may have a layered structure, that is the first electrode 1, the hole transport layer 2, the light-emitting layer 3, the electron transport layer 4, and the second electrode 5 may be layered in this order. On the other hand, the light-emitting device 101 may have an inverted structure, that is the second electrode 5, the electron transport layer 4, the light-emitting layer 3, the hole transport layer 2, and the first electrode 1 may be layered in this order. The light-emitting device 101 may be a top-emitting type in which light is extracted from the light-emitting device 101 from the side opposite the substrate (a substrate 28 and the like described below) or may be a bottom-emitting type in which light is extracted from the substrate side.

The first electrode 1, the hole transport layer 2, the electron transport layer 4, and the second electrode 5 may be formed by various known film forming techniques.

Depending on the selection of a layered structure or an inverted structure for the light-emitting device 101 and depending on the selection of the type for extracting light from the light-emitting device 101, the first electrode 1 and the second electrode 5 can be made a transparent electrode or a reflective electrode. Examples of the material constituting the first electrode 1 and the second electrode 5 include Al, Mg, Li, Ag, an alloy containing at least one thereof metals, Indium Tin Oxide (ITO), Indium Zinc Oxide (IZO), and Indium Gallium Zinc Oxide (IGZO). In addition, the first electrode 1 and the second electrode 5 may be formed by a film forming method such as the vacuum vapor deposition technique or the sputtering method, for example. In addition, when the material of the first electrode 1 and the second electrode 5 is a compound material such as ITO or the like, the first electrode 1 and the second electrode 5 may be formed by applying a colloidal solution containing nanoparticles of the compound material. Alternatively, when the material of the first electrode 1 and the second electrode 5 is such a compound material, the first electrode 1 and the second electrode 5 may be formed by applying and baking an appropriate precursor for the compound material.

Methods similar to the methods of forming the first electrode 1 and the second electrode 5 can be applied to forming the hole transport layer 2 and the electron transport layer 4.

However, the layer that comes into contact with the light-emitting layer 3 is preferably forming using a method that resulting in minimal damage to the light-emitting layer 3, with examples being the colloidal solution application described above and the application and baking of the precursor described above. The layer that comes into contact with the light-emitting layer 3 may be formed via vapor deposition or a sputtering method. However, these methods may damage the light-emitting layer 3 due to heat or charged particles and thus must be used carefully.

When a panel including the light-emitting device 101 is made, photolithography, mask vapor deposition, an ink-jet method, or the like can be appropriately used as necessary.

In the following description, the light-emitting device 101 has a layered structure and is a top-emitting type. In the light-emitting device 101 having a layered structure and being a top-emitting type, the first electrode 1 is formed on the substrate.

The first electrode 1 can be formed by forming a film of ITO, for example, on the substrate via a sputtering method. The thickness of the first electrodes 1 may be 100 nm or less. Examples of materials constituting the first electrode 1 that can enhance the efficiency of extracting light from the light-emitting device 101 include Al, Ag, and an alloy containing at least one thereof. On the other hand, when it is important to match the electron energy level of the first electrode 1 and the electron energy level of the hole transport layer 2 (or the hole injection layer), ITO is a suitable material for the first electrode 1. Accordingly, the first electrode 1 may have a layered structure including a reflective layer containing Al and/or Ag, an insulating layer containing polyimide, for example, and an ITO layer. In the case of such a layered structure, a contact hole for electrically connecting the ITO layer and a Thin Film Transistor (TFT) may be formed extending through the insulating layer and the reflective layer. The contact hole can be formed by patterning based on lithography, for example.

The hole transport layer 2 is disposed between the first electrode 1 and the light-emitting layer 3. The hole transport layer 2 is a layer that transports positive holes from the first electrode 1 to the light-emitting layer 3. The hole transport layer 2 can be formed on the first electrode 1 via an application method, sputtering method, or vapor deposition. The thickness of the hole transport layer 2 may be approximately 10 nm. Examples of the material constituting the hole transport layer 2 include NiO, MgNiO, PVI, TFB, and $Cr_2O_3$. The material constituting the hole transport layer 2 may be a known material. Among these examples of the material constituting the hole transport layer 2, a metal oxide has higher chemical stability than an organic material. When the hole transport layer 2 is made of such a metal oxide, oxygen deficiency causes conduction electrons to be produced. Thus, in this case, the oxygen deficiency density at the hole transport layer 2 can be controlled according to the oxygen concentration of the gas used to form the hole transport layer 2 via a sputtering method, for example.

As necessary, the light-emitting device 101 may include a hole injection layer (not illustrated) containing PEDOT for injecting positive holes into the hole transport layer 2 disposed between the first electrode 1 and the hole transport layer 2. Also, as necessary, the light-emitting device 101 may include a passivation film (a passivation film 32 described below and the like) containing $Al_2O_3$ disposed between the hole transport layer 2 and the light-emitting layer 3. The hole injection layer and the hole transport layer 2 formed using an inorganic material more chemically stable than an organic material each have high hole injection efficiency and high reliability over an extended period of time due to being able to suppress degradation caused by anode oxidation.

The light-emitting layer 3 is disposed between the first electrode 1 and the second electrode 5. The light-emitting layer 3 will be described below in detail.

The electron transport layer 4 is disposed between the light-emitting layer 3 and the second electrode 5. The electron transport layer 4 is a layer for transporting electrons from the second electrode 5 to the light-emitting layer 3. Examples of the material constituting the electron transport layer 4 include ZnO, MgO, MgZnO, IZO, ZAO, IGZO, and $TiO_2$. For example, a known material having an electron energy level capable of transporting electrons to the light-emitting layer 3 with high efficiency according to the CBM value in the light-emitting layer 3 can be used. The electron transport layer 4 can be formed by applying a colloidal solution containing nanoparticles of the material constituting the electron transport layer 4 on the light-emitting layer 3. The electron transport layer 4 can also be formed on the light-emitting layer 3 by a printing method using an ink in which the nanoparticles are dispersed or photolithography using a resist in which the nanoparticles are dispersed. The electron transport layer 4 can also be formed on the light-emitting layer 3 using the material constituting the electron transport layer 4 as the target for a sputtering method, sublimation, or vapor deposition.

The structure of the light-emitting device 101 at the periphery of the light-emitting layer 3, that is the hole transport layer 2 and the electron transport layer 4, can be implemented via a known technique.

The second electrode 5 is disposed opposing the first electrode 1. Examples of materials constituting the second electrode 5 include Al, Mg, Ag, Li, and an alloy containing at least one thereof, that is a known material with a relatively low work function. The second electrode 5 can be formed on the electron transport layer 4 via a sputtering method or vapor deposition.

The light-emitting layer 3 is disposed between the first electrode 1 and the second electrode 5. In the light-emitting layer 3, when a current flows from the first electrode 1 to the second electrode 5, the light-emitting layer 3 emits light.

Figure 2:
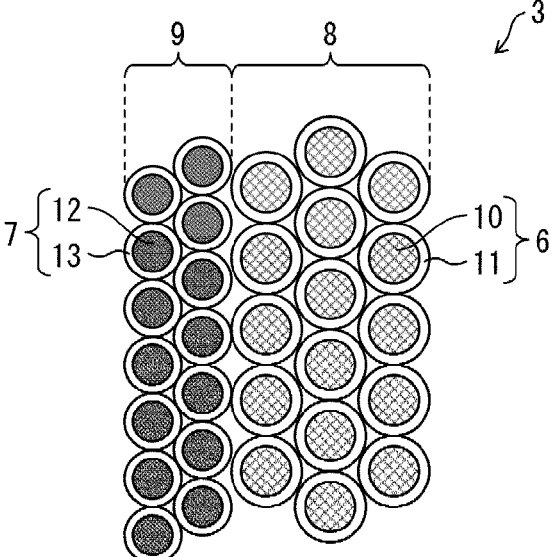
FIG. 2 is a cross-sectional view illustrating a specific configuration of a light-emitting layer.

FIG. 2 is a cross-sectional view illustrating a specific configuration of the light-emitting layer 3. The light-emitting layer 3 includes a plurality of first quantum dots 6 and a plurality of second quantum dots 7. The light-emitting layer 3 has a layered structure including a first layer 8 including the plurality of first quantum dots 6 and a second layer 9 including the plurality of second quantum dots 7. Hereinafter, the plurality of first quantum dots 6 and the plurality of second quantum dots 7 may be referred to as a "first quantum dot group" and a "second quantum dot group", respectively.

The first quantum dots 6 are each semiconductor quantum dots that emits light of either red (R), green (G), or blue (B). The first quantum dot 6 includes a first core 10 having an emission peak in a visible light region. Examples of the material constituting the first core 10 include known core materials, such as II-VI compounds such as ZnSe, III-V compounds such as InP, chalcogenides, and perovskites. As illustrated in FIG. 2, the first quantum dot 6 preferably includes, in addition to the first core 10, a first shell 11 disposed on the outer side of the first core 10 covering the first core 10. Although not illustrated, the first quantum dot 6 preferably includes an appropriate organic ligand or an appropriate inorganic ligand to passivate defects formed in the surface of the first shell 11 and/or promote dispersion of the multiple first quantum dots 6 in the application solvent. Although the particle size of the first core 10 varies depending on the emission wavelength of the first quantum dot 6 and the material constituting the first core 10, the particle size is generally enough to produce a quantum blocking effect and, specifically, preferably ranges from several nm to tens of nm.

The first layer 8 can be formed by applying a colloidal solution obtained by dispersing a large number of the first quantum dots 6 in a solvent to the second layer 9 by, for example, a spin coating method. Also, the first layer 8 may be formed by printing using an inkjet method, or may be formed by patterning based on photolithography using a resist in which a large number of the first quantum dots 6 are dispersed.

The second layer 9 is disposed on the side opposite to light extraction side of the light-emitting device 101 when viewed from the first layer 8 and between the first layer 8 and the hole transport layer 2.

The emission wavelength of the second quantum dot 7 is shorter than the emission wavelength of the first quantum dot 6. The second quantum dot 7 includes a second core 12 having an emission peak in the near-ultraviolet region (wavelengths from 300 nm to 380 nm) or the ultraviolet region (wavelengths of 300 nm or less). The options for the material constituting the second core 12 may be the same as the options for the material constituting the first core 10. The electron affinity of the second core 12 is less than the electron affinity of the first core 10. As illustrated in FIG. 2, the second quantum dot 7 preferably includes, in addition to the second core 12, a second shell 13 disposed on the outer side of the second core 12 covering the second core 12. Although not illustrated, the second quantum dot 7 preferably includes an appropriate organic ligand or an appropriate inorganic ligand to passivate defects formed in the surface of the second shell 13 and/or promote dispersion of the multiple second quantum dots 7 in the application solvent. Although the particle size of the second core 12 varies depending on the emission wavelength of the second quantum dot 7 and the material constituting the second core 12, the particle size is generally enough to produce a quantum blocking effect and, specifically, preferably ranges from several nm to tens of nm.

The second layer 9 can be formed by applying a colloidal solution obtained by dispersing a large number of the second quantum dots 7 in a solvent to the hole transport layer 2 by, for example, a spin coating method. Also, the second layer 9 may be formed by printing using an inkjet method, or may be formed by patterning based on photolithography using a resist in which a large number of the second quantum dots 7 are dispersed.

When the material constituting the first core 10 and the material constituting the second core 12 are the same, the particle size of the first core 10 is greater than the particle size of the second core 12. In general, for a semiconductor material used as a core of a quantum dot, the curvature of the valence band is greater than the curvature of the conduction band. Thus, when the particle size of the core of the quantum dot is changed, the change in the electron energy level occurs almost exclusively in the conduction band. When the material constituting the first core 10 and the material constituting the second core 12 are the same and the particle size of the first core 10 is greater than the particle size of the second core 12, the energy level of the valence band maximum in the first core 10 is substantially the same as the energy level of the valence band maximum in the second core 12. Thus, in this case, it is possible to suppress the injection of positive holes from the first quantum dots 6 being inhibited by the second quantum dots 7.

FIG. 3 is a table listing examples of material, particle size, conduction band minimum (CBM), valence band maximum (VBM), and emission peak for the first core 10 and the second core 12. As listed in Example 4 of FIG. 3, the material constituting the first core 10 and the material constituting the second core 12 may be the same, but in this case, the particle size of the first core 10 is greater than the particle size of the second core 12. Also, as listed in Examples 1 to 3 of FIG. 3, the material constituting the first core 10 and the material constituting the second core 12 may be different. Although not listed in FIG. 3, the material constituting the first shell 11 and the material constituting the second shell 13 may be the same or different. "The material constituting the first core 10 and the material constituting the second core 12 being the same" means that the composition constituting the material constituting the first core 10 and the composition constituting the material constituting the second core 12 are the same. Also, "the material constituting the first core 10 and the material constituting the second core 12 being different" means that the composition constituting the material constituting the first core 10 and the composition constituting the material constituting the second core 12 are different.

In the light-emitting layer 3, when a current flows from the first electrode 1 to the second electrode 5, the first quantum dots 6 emit visible light and the second quantum dots 7 emit near-ultraviolet light or ultraviolet light. Specifically, the second quantum dots 7 emit near-ultraviolet light when the second core 12 has an emission peak in the near-ultraviolet region and emits ultraviolet light when the second core 12 has an emission peak in the ultraviolet region. For this reason, the second quantum dot 7 preferably includes the second shell 13. The second quantum dot 7 including the second shell 13 allows the effects of defects or the like formed on the surface of the second core 12 to be greatly reduced. Thus, it is possible to reduce the possibility of a reactive current being produced due to a defect formed on the surface of the second core 12. In addition, it is possible to suppress electrons and holes being captured by the second quantum dots 7.

According to the light-emitting device 101, the electrons overflowing from the second quantum dots 7 and a portion of the holes injected from the hole transport layer 2 to the first quantum dots 6 via the second quantum dots 7 combine in the second quantum dots 7. Thus, the second quantum dots 7 emit near-ultraviolet light or ultraviolet light according to the emission peak of the second core 12. The near-ultraviolet light or ultraviolet light emitted by the second quantum dots 7 is absorbed by the first quantum dots 6.

Figure 4:
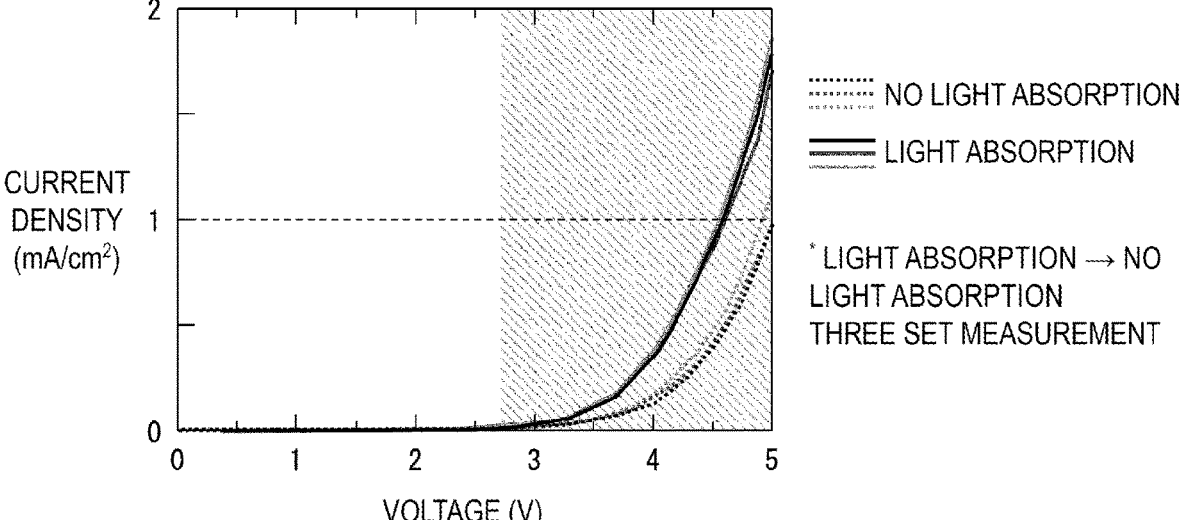
FIG. 4 is a graph showing a change in the current-voltage characteristic of first quantum dots relating to the light emission of the first quantum dots caused by the first quantum dots absorbing light of the emission wavelength of second quantum dots.

When the emitting first quantum dots 6 absorb light, a change occurs in the current-voltage characteristic of the first quantum dots 6 relating to the light emission of the first quantum dots 6. In order to verify the change in the current-voltage characteristic, a verification light-emitting device including only the first quantum dots 6 as a light-emitting layer was prepared, and an experiment was performed in which the verification light-emitting device was irradiated with light from the outside having the emission wavelength (380 nm) of the second quantum dots 7. FIG. 4 is a graph showing a change in the current-voltage characteristic of the first quantum dots 6 relating to the light emission of the first quantum dots 6 caused by the first quantum dots 6 absorbing light of the emission wavelength of the second quantum dots 7. In the graph in FIG. 4, the horizontal axis represents the drive voltage (unit: V) of the first quantum dots 6, and the vertical axis represents the density (unit: mA/cm$^2$) of the current flowing through the first quantum dots 6. In FIG. 4, "no light absorption" indicates before light absorption by the emitting first quantum dots 6, and "light absorption" indicates during light absorption by the emitting first quantum dots 6. According to FIG. 4, when the emitting first quantum dots 6 absorb light, a phenomenon occurs in which the density of the current flowing through the first quantum dots 6 increases relative to the drive voltage of the first quantum dots 6. It is presumed that this phenomenon is caused by electron-positive hole pairs that are generated in the first quantum dots 6 that have absorbed light and do not depend on an external electrical field. The electron-positive hole pairs form excitons, and the electrons and the positive holes combine with one another for the lifetime of the excitons, whereby light having the same wavelength as the emission wavelength of the first quantum dots 6 is generated. According to this verification, when an external power supply (not illustrated) is connected to the light-emitting device 101 including the first quantum dots 6 and the second quantum dots 7 to drive the light-emitting device 101, it can be said that the luminous efficiency of the light-emitting device 101 with respect to the voltage of the external power supply is enhanced. The carriers overflowing from the first quantum dots 6 cannot contribute to the light emission of the first quantum dots 6 in the related art. In the light-emitting device 101, the carriers are converted into light by the second quantum dots 7, and the light is absorbed by the first quantum dots 6. In this manner, the density of the current flowing through the first quantum dots 6 can be increased.

The second quantum dots 7 are light-emitting quantum dots and have an emission wavelength that is shorter than the emission wavelength of the first quantum dots 6. When the first quantum dots 6 emit either a R, G, or B light, if the second quantum dots 7 emit either a G, B, or a bluish purple light, the effect of enhancing the luminous efficiency of the light-emitting device 101 can be expected in principle. Regardless of the emission wavelength of the first quantum dots 6 emitting visible light, if the second quantum dots 7 emit, for example, near-ultraviolet light or bluish purple light, the effect of enhancing the luminous efficiency of the light-emitting device 101 can be expected in principle.

According to the light-emitting device 101, it is possible to cause the second quantum dots 7 to emit light via electrons and positive holes that do not contribute to light emission by the first quantum dots 6. By exciting the first quantum dots 6 with the near-ultraviolet light or the ultraviolet light emitted from the second quantum dots 7, the amount of light emitted by the first quantum dots 6 can be increased, and thus the luminous efficiency of the first quantum dots 6 can be increased.

The thickness of the first layer 8 is typically approximately 50 nm. The thickness of the second layer 9 is preferably in a range from 10 nm to half the thickness of the first layer 8 or less. When the thickness of the second layer 9 is greater than half the thickness of the first layer 8, the second layer 9 inhibits hole injection to the first quantum dot groups, and the luminous efficiency of the light-emitting device 101 for light with the desired emission peak may be decreased. When the thickness of the second layer 9 is less than 10 nm, the amount of light emitted by the second quantum dot groups may not be enough to sufficiently increase the luminous efficiency of the light-emitting device 101.

A light-emitting device based on the light-emitting device 101 with the light-emitting layer 3 substituted with the first layer 8, in other words, with the second quantum dot groups omitted from the light-emitting device 101, is referred to as a "light-emitting device according to a comparative example". Hereinafter, hole injection into the first quantum dots 6 and light emission regarding the light-emitting device according to a comparative example and the light-emitting device 101 will be described.

Figure 5:
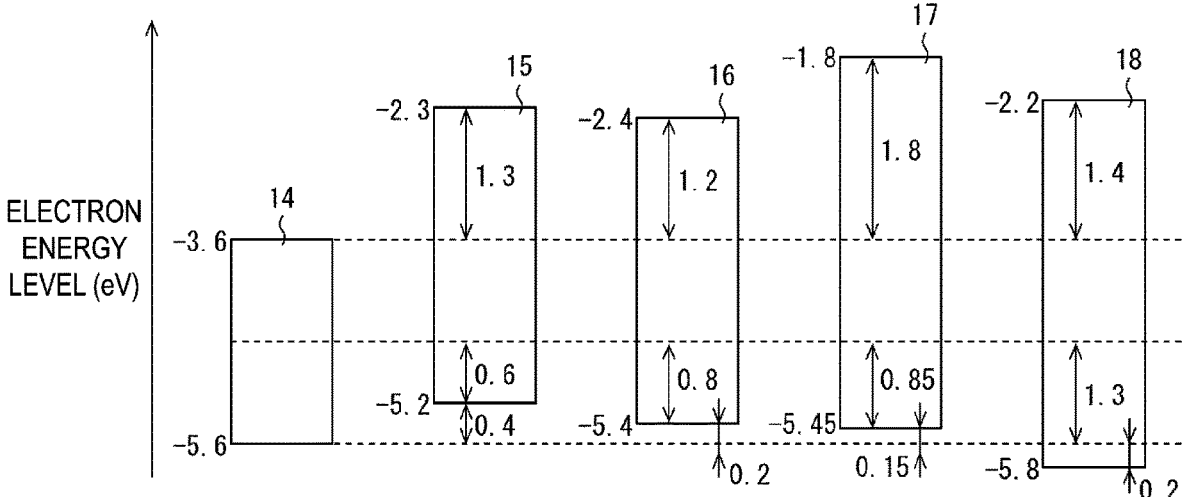
FIG. 5 is a diagram for comparing examples of band gaps in an isolated state of various materials selected for a hole transport layer and the first quantum dots.

FIG. 5 is a diagram for comparing examples of band gaps in an isolated state of various materials selected for the hole transport layer 2 and the first quantum dots 6. The upper end of each of the band gaps 14 to 18 represents the CBM, and the lower end represents the VBM. The band gaps 14 to 18 represent the band gap of the first quantum dots 6, the band gap of TPD, the band gap of TFB, the band gap of NiO, and the band gap of PVK, respectively.

Figure 6:
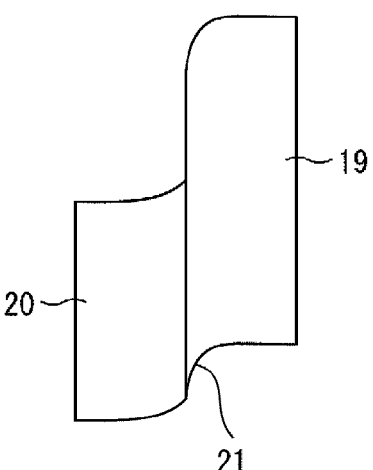
FIG. 6 is a diagram illustrating a change in the band gap with respect to the position in a light-emitting device according to a comparative example when TFB is selected as the material of the hole transport layer.
Figure 7:
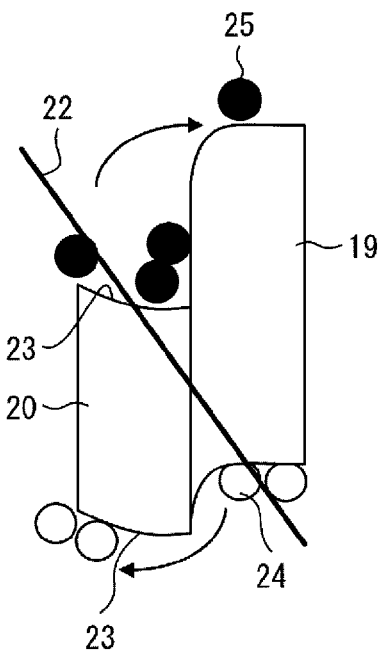
FIG. 7 is a diagram illustrating a change in the band gap with respect to the position in the light-emitting device according to the comparative example when TFB is selected as the material of the hole transport layer.

FIGS. 6 and 7 are diagrams illustrating a change in the band gap with respect to the position in the light-emitting device according to the comparative example when TFB is selected as the material of the hole transport layer 2. The left-and-right direction in FIGS. 6 and 7 refers to positions in the layering direction in the light-emitting device according to the comparative example, with the first electrode 1, the hole transport layer 2, the first layer 8, the electron transport layer 4, and the second electrode 5 being layered in this order. In FIGS. 6 and 7, the right side corresponds to the first electrode 1 side, and the left side corresponds to the second electrode 5 side. Also, FIG. 6 illustrates a state in which a current is not flowing to the first layer 8 and the first layer 8 is not emitting light. FIG. 7 illustrates a state in which a current is flowing to the first layer 8 and the first layer 8 is emitting light.

In the light-emitting device according to the comparative example, a curve is formed in the left-and-right direction of FIG. 6 in a band gap 19 of the hole transport layer 2 and a band gap 20 of the first layer 8 due to the joining of the hole transport layer 2 and the first layer 8. Furthermore, as illustrated in FIG. 6, in the light-emitting device according to the comparative example, a barrier 21 for hole injection from the hole transport layer 2 to the first layer 8 is formed.

A power supply (not illustrated) is connected to the light-emitting device according to the comparative example to inject carriers into the first layer 8. At this time, as illustrated in FIG. 7, in response to an electrical field 22 caused by the power supply, with respect to the band gap 20 of the first layer 8, a curve 23 is generated warping upward to the second electrode 5 side (that is, the electron affinity is decreased). As a result, at the interface where the hole transport layer 2 and the first layer 8 are joined or nearby, the probability of existence of positive holes 24 is very low, while the probability of existence of electrons 25 is very high. Thus, at the interface where the hole transport layer 2 and the first layer 8 are joined or nearby, the density of the positive holes 24 and the density of the electrons 25 differ greatly, giving the light-emitting device according to the comparative example a low luminous efficiency.

Figure 8:
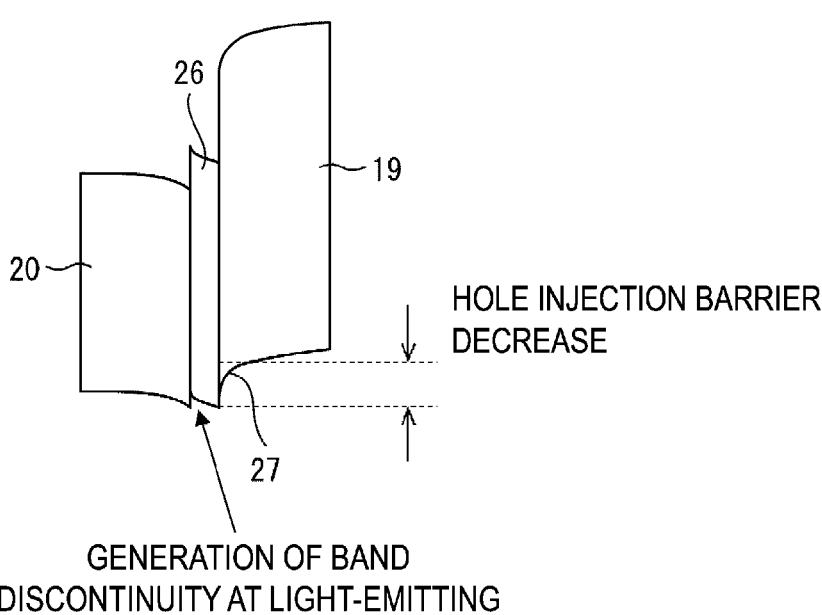
FIG. 8 is a diagram illustrating a change in the band gap with respect to the position in the light-emitting device illustrated in FIG. 1 when TFB is selected as the material of the hole transport layer.
Figure 9:
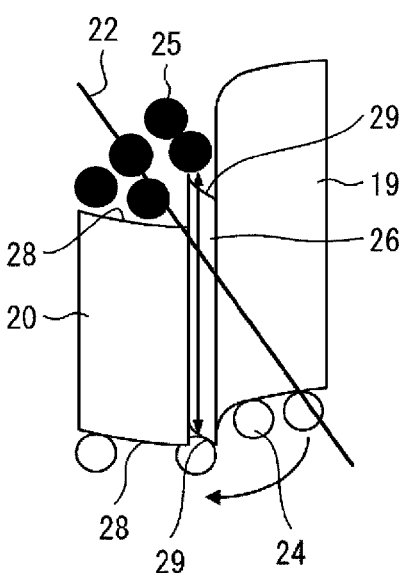
FIG. 9 is a diagram illustrating a change in the band gap with respect to the position in the light-emitting device illustrated in FIG. 1 when TFB is selected as the material of the hole transport layer.

FIGS. 8 and 9 are diagrams illustrating a change in the band gap with respect to the position in the light-emitting device 101 when TFB is selected as the material of the hole transport layer 2. The left-and-right direction in FIGS. 8 and 9 refers to positions in the layering direction in the light-emitting device 101, with the first electrode 1, the hole transport layer 2, the light-emitting layer 3, the electron transport layer 4, and the second electrode 5 being layered in this order. In FIGS. 8 and 9, the right side corresponds to the first electrode 1 side, and the left side corresponds to the second electrode 5 side. Also, FIG. 8 illustrates a state in which a current is not flowing to the light-emitting layer 3 and the light-emitting layer 3 is not emitting light. FIG. 9 illustrates a state in which a current is flowing to the light-emitting layer 3 and the light-emitting layer 3 is emitting light.

The second layer 9 is disposed between the first layer 8 and the hole transport layer 2. According to a band gap 26 of the second layer 9, the electron affinity of the second layer 9 is less than the electron affinity of the first layer 8, and the VBM of the second layer 9 is substantially the same as the VBM of the first layer 8. At this time, according to FIG. 8, a barrier 27 for hole injection from the hole transport layer 2 to the light-emitting layer 3 is lower than the barrier 21. The difference between the height of the barrier 27 and the height of the barrier 21 is substantially equal to the difference between the band gap 20 of the first layer 8 and the band gap 26 of the second layer 9. According to FIG. 8, at the interface between the first layer 8 and the second layer 9, the band gap 20 of the first layer 8 and the band gap 26 of the second layer 9 do not completely coincide with each other.

A power supply (not illustrated) is connected to the light-emitting device 101 to inject carriers into the light-emitting layer 3. At this time, as illustrated in FIG. 9, in response to an electrical field 22 caused by the power supply, with respect to the band gap 20 of the first layer 8, a curve 28 is generated warping upward to the second electrode 5 side. In a similar manner, at this time, as illustrated in FIG. 9, in response to an electrical field 22, with respect to the band gap 26 of the second layer 9, a curve 29 is generated warping upward to the second electrode 5 side. Since the barrier 27 is lower than the barrier 21, at the interface where the hole transport layer 2 and the light-emitting layer 3 are joined or nearby, the probability of existence of the positive holes 24 can be made high. Thus, the luminous efficiency of the light-emitting device 101 is higher than the luminous efficiency of the light-emitting device according to the comparative example.

In the light-emitting device 101, overflow of electrons to the hole transport layer 2 is suppressed. Accordingly, when the hole transport layer 2 is made of an organic material, an anodic reaction of the hole transport layer 2 can be suppressed, enabling the long term reliability to be increased.

It is not essential that the light-emitting layer 3 of the light-emitting device 101 has a layered structure including the first layer 8 and the second layer 9. In other words, it is sufficient that the light-emitting layer 3 of the light-emitting device 101 includes the first quantum dots 6 and the second quantum dots 7.

Second Embodiment

Figure 10:
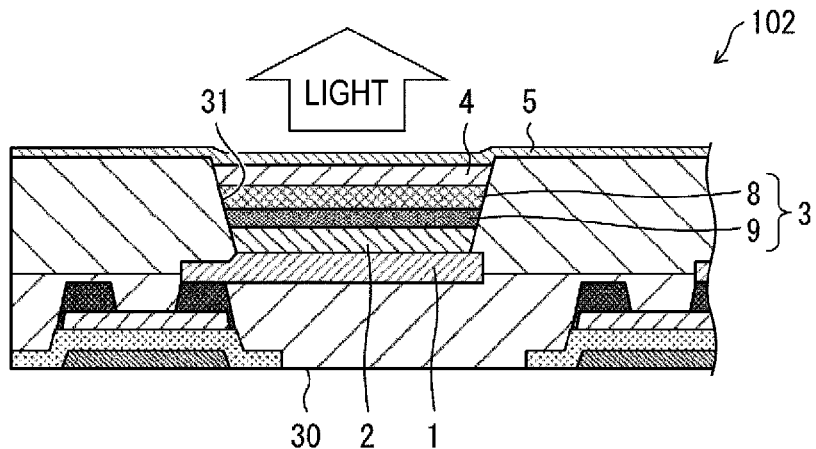
FIG. 10 is a cross-sectional view illustrating a schematic configuration of a light-emitting device according to a first example of a second embodiment of the disclosure.

FIG. 10 is a cross-sectional view illustrating a schematic configuration of a light-emitting device 102 according to a first example of the second embodiment of the disclosure. The light-emitting device 102 includes a substrate 30, the first electrode 1, the hole transport layer 2, the light-emitting layer 3, the electron transport layer 4, the second electrode 5, and a bank 31. The light-emitting layer 3 includes the first layer 8 and the second layer 9.

The light-emitting device 102 has a layered structure and is a top-emitting type. The first electrode 1 is installed on the substrate 30. In the light-emitting device 102, light is extracted from the second electrode 5 side, which is the side opposite to the substrate 30 with respect to the light-emitting layer 3.

The second layer 9 is disposed on the side opposite to the light extraction side of the light-emitting device 102 with respect to the first layer 8. Accordingly, near-ultraviolet light or ultraviolet light emitted by the second quantum dots 7 (see FIG. 2) included in the second layer 9 can be efficiently absorbed by the first quantum dots 6 (see FIG. 2) included in the first layer 8.

The bank 31 is disposed in contact with the side surface of the hole transport layer 2, the side surface of the light-emitting layer 3, and the side surface of the electron transport layer 4. The bank 31 absorbs light of the emission peak of the second quantum dots 7. For example, the bank 31 preferably contains an ultraviolet absorbent (ultraviolet absorbing member) that absorbs near-ultraviolet light and/or ultraviolet light. The bank 31 is formed of a photosensitive organic material, for example. Since most photosensitive organic material can absorb light with a wavelength equal to or shorter than the near-ultraviolet region, the bank 31 that absorbs near-ultraviolet light and/or ultraviolet light can be easily formed using photosensitive organic material.

Figure 11:
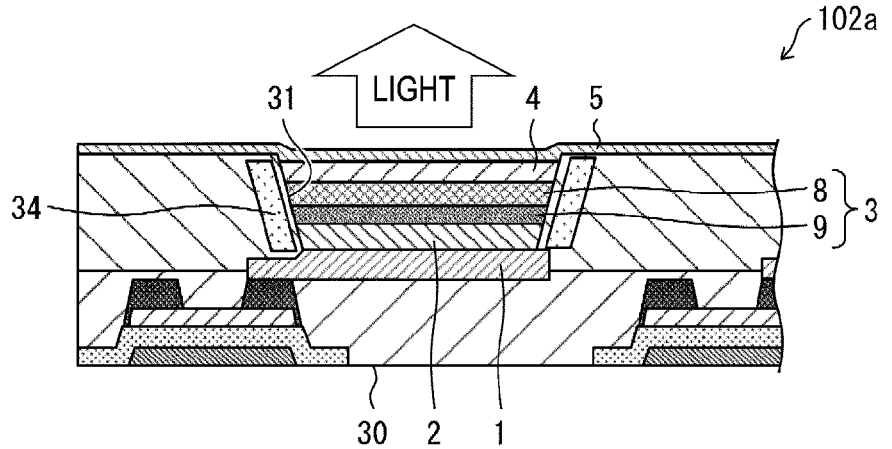
FIG. 11 is a cross-sectional view illustrating a schematic configuration of a light-emitting device according to a modified example of the first example of the second embodiment of the disclosure.

The bank 31 may reflect light of the emission peak of the second quantum dots 7. In a specific example, as in a light-emitting device 102a illustrated in FIG. 11, the bank 31 may include a metal film 34 opposing the side surface of the light-emitting layer 3. The film thickness of the metal film 34 is preferably approximately 100 nm. Examples of the material constituting the metal film 34 include Al and Ag.

Since the bank 31 comes into contact with the side surface of the light-emitting layer 3 and surrounds the side surface of the light-emitting layer 3, near-ultraviolet light or ultraviolet light emitted by the second quantum dots 7 can be prevented from leaking outside the light-emitting device 102.

Figure 12:
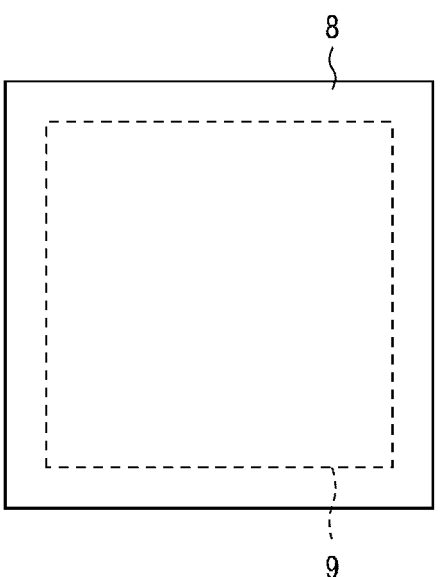
FIG. 12 is a plan view of a first layer and a second layer in the light-emitting device illustrated in FIG. 10.

FIG. 12 is a plan view of the first layer 8 and the second layer 9 in the light-emitting device 102. As illustrated in FIG. 12, all of the second layer 9 overlaps the first layer 8 in a plan view of the light-emitting device 102. Accordingly, near-ultraviolet light or ultraviolet light emitted by the second quantum dots 7 can be efficiently absorbed by the first quantum dots 6.

Figure 13:
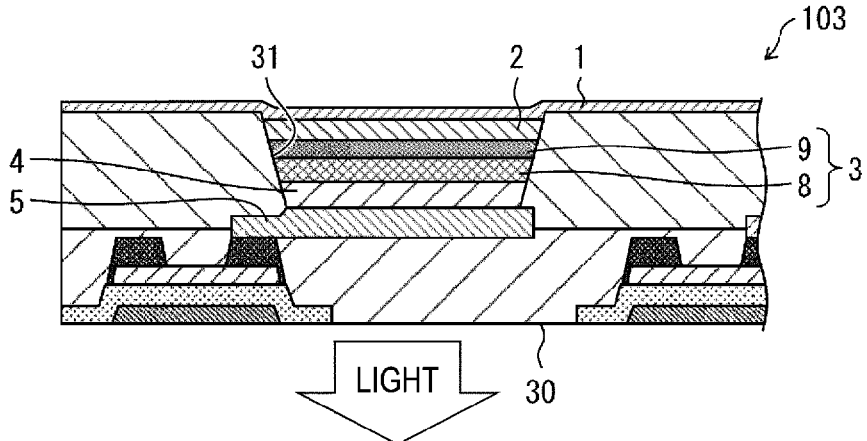
FIG. 13 is a cross-sectional view illustrating a schematic configuration of a light-emitting device according to a second example of the second embodiment of the disclosure.

FIG. 13 is a cross-sectional view illustrating a schematic configuration of a light-emitting device 103 according to a second example of the second embodiment of the disclosure. The difference between the configuration of the light-emitting device 102 and the configuration of the light-emitting device 103 is as follows. That is, the light-emitting device 103 has an inverted structure and is a bottom-emitting type. The second electrode 5 is installed on the substrate 30. In the light-emitting device 103, light is extracted from the second electrode 5 side, which is the substrate 30 side with respect to the light-emitting layer 3.

Other than the differences described above, the configuration of the light-emitting device 102 and the configuration of the light-emitting device 103 are the same.

The second quantum dots 7 emit light at a shorter wavelength than the first quantum dots 6. So that the first quantum dots 6 can be used when emitting either R, G, or B light, the second quantum dots 7 preferably emit near-ultraviolet light or bluish purple light. Thus, the light emission from the second quantum dots 7 can preferably not be seen from outside the light-emitting device. Accordingly, in practice, the second layer 9 is preferably located away from the light extraction side of the light-emitting device. In the light-emitting device 102, the second layer 9 is preferably located below the first layer 8. Conversely, in the light-emitting device 103, the second layer 9 is preferably located above the first layer 8.

Figure 14:
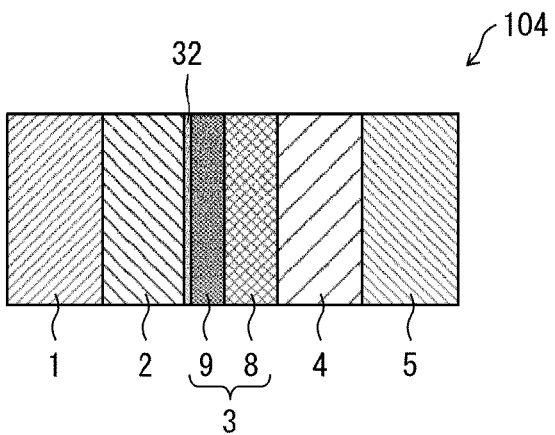
FIG. 14 is a cross-sectional view illustrating a schematic configuration of a light-emitting device according to a third example of the second embodiment of the disclosure.

FIG. 14 is a cross-sectional view illustrating a schematic configuration of a light-emitting device 104 according to a third example of the second embodiment of the disclosure. The configuration of the light-emitting device 104 is different from the configuration of the light-emitting device 101 in that the passivation film 32 is provided between the hole transport layer 2 and the second layer 9.

Figure 15:
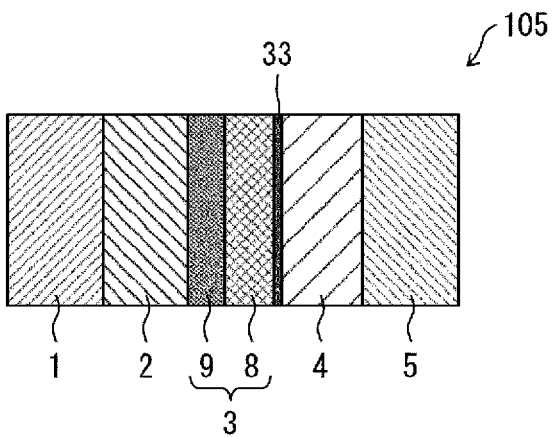
FIG. 15 is a cross-sectional view illustrating a schematic configuration of a light-emitting device according to a fourth example of the second embodiment of the disclosure.

FIG. 15 is a cross-sectional view illustrating a schematic configuration of a light-emitting device 105 according to a fourth example of the second embodiment of the disclosure. The configuration of the light-emitting device 105 is different from the configuration of the light-emitting device 101 in that a passivation film 33 is provided between the electron transport layer 4 and the first layer 8.

Examples of the material constituting the passivation films 32 and 33 include a dielectric and an insulator, and examples of a dielectric and an insulator include $Al_2O_3$, AlN, and $SiO_2$. The passivation films 32 and 33 are provided to enhance the carrier balancing of the light-emitting devices 104 and 105, respectively.

Other than the differences described above, the configuration of the light-emitting device 101 and the configuration of the light-emitting device 104 and the light-emitting device 105 are the same.

Figure 16:
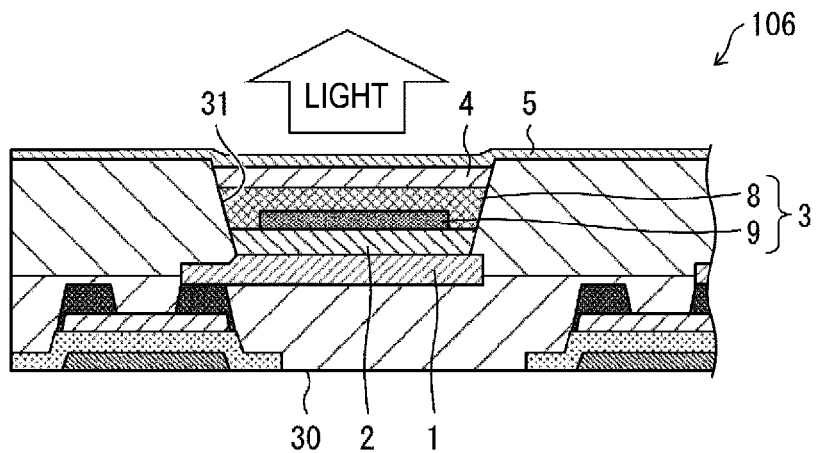
FIG. 16 is a cross-sectional view illustrating a schematic configuration of a light-emitting device according to a fifth example of the second embodiment of the disclosure.

FIG. 16 is a cross-sectional view illustrating a schematic configuration of a light-emitting device 106 according to a fifth example of the second embodiment of the disclosure. The difference between the configuration of the light-emitting device 102 and the configuration of the light-emitting device 106 is as follows. That is, the second layer 9 is provided in island shapes separated from the bank 31, and the first layer 8 covers the side surface of the second layer 9. Accordingly, near-ultraviolet light or ultraviolet light emitted by the second quantum dots 7 can be efficiently absorbed by the first quantum dots 6.

Other than the differences described above, the configuration of the light-emitting device 102 and the configuration of the light-emitting device 106 are the same. Note that instead of the light-emitting device 102, a configuration corresponding to the differences described above may be applied to the light-emitting device 103.

Additional Items

A light-emitting device including any one of the light-emitting devices 101 to 106 is also included in the scope of the disclosure. A display device including any one of the light-emitting devices 101 to 106 and a display device including the light-emitting device are also included in the scope of the disclosure.

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in each of the embodiments.

The invention claimed is:

1. A light-emitting device comprising:
   a first electrode;
   a second electrode;
   a light-emitting layer disposed between the first electrode and the second electrode; and
   a hole transport layer disposed between the first electrode and the light-emitting layer,
   wherein the light-emitting layer includes:
   a first quantum dot including a first core with an emission peak in a visible light region, and
   a second quantum dot including a second core with an emission peak in a near-ultraviolet region or an ultraviolet region, and
   wherein:
   the light-emitting layer has a layered structure comprising a first layer including the first quantum dot and a second layer including the second quantum dot,
   the second layer is disposed between the first layer and the hole transport layer,
   a thickness of the second layer is in a range from 10 nm to half a thickness of the first layer or less, and near-ultraviolet light or ultraviolet light emitted by the second quantum dot is absorbed by the first quantum dot.

2. The light-emitting device according to claim 1, wherein the first quantum dot includes a first shell disposed on an outer side of the first core, the second quantum dot includes a second shell disposed on an outer side of the second core, and a material forming the first shell and a material forming the second shell are identical.

3. The light-emitting device according to claim 1, wherein the first quantum dot includes a first shell disposed on an outer side of the first core, the second quantum dot includes a second shell disposed on an outer side of the second core, and a material forming the first shell is different from a material forming the second shell.

4. The light-emitting device according to claim 1, wherein an electron affinity of the second core is less than an electron affinity of the first core.

5. The light-emitting device according to claim 1, further comprising:

a bank disposed in contact with a side surface of the light-emitting layer, the bank absorbing light of an emission peak of the second quantum dot.

6. The light-emitting device according to claim 1, further comprising:

a bank disposed in contact with a side surface of the light-emitting layer, the bank reflecting light of an emission peak of the second quantum dot.

7. The light-emitting device according to claim 6, wherein the bank includes a metal film disposed opposite the side surface of the light-emitting layer.

8. The light-emitting device according to claim 1, wherein an entirety of the second layer overlaps the first layer in a plan view of the light-emitting device.

9. The light-emitting device according to claim 1, wherein the first layer covers a side surface of the second layer.

10. The light-emitting device according to claim 1, wherein a material forming the first core and a material forming the second core are identical, and a particle size of the first core is greater than a particle size of the second core.

11. The light-emitting device according to claim 1, wherein a material forming the first core and a material forming the second core are different.

* * * * *